United States Patent [19]
Gilbert et al.

[11] Patent Number: 5,847,614
[45] Date of Patent: Dec. 8, 1998

[54] LOW POWER CHARGE PUMP

[75] Inventors: Barrie Gilbert; Daryl Carbonari; Eberhard Brunner, all of Portland; Fred Weiss, Newberg, all of Oreg.

[73] Assignee: Analog Devices, Inc., Norwood, Mass.

[21] Appl. No.: 751,224

[22] Filed: Nov. 15, 1996

[51] Int. Cl.$^6$ .............................. H03L 7/093; H03L 7/18
[52] U.S. Cl. .............................. 331/14; 327/157; 331/17; 331/25
[58] Field of Search ................................. 331/14, 17, 25; 327/148, 157

[56] References Cited

U.S. PATENT DOCUMENTS 4,893,094  1/1990  Herold et al. .............................. 331/17
5,475,877  12/1995  Adachi ....................................... 331/14

Primary Examiner—Siegfried H. Grimm
Attorney, Agent, or Firm—Marger, Johnson & McCollom, P.C.

[57] ABSTRACT

A charge pump in a phase locked loop is enabled only when a loop filter needs to be updated, thereby reducing the power consumption of the charge pump. The charge pump is enabled or disabled in response to an enable signal which is generated by a latch. The enable signal is activated by look-ahead signals which are activated in advance of either a pulse from a reference signal or a pulse from a variable signal so as to allow the charge pump to stabilize before providing the charge current to update the loop filter. Logic signals from a programmable divider and reference signal generator are used to generate the look-ahead signals. The charge pump is disabled by a reset signal from a phase-frequency detector after the loop filter is updated. The charge pump includes a current switch for generating source and sink charge currents in response to pump-up and pump-down control signals. A bias cell provides two reference signals to the current switch. The reference signals are disabled in response to an enable signal, thereby disabling the current switch and reducing the power consumption of the charge pump.

14 Claims, 5 Drawing Sheets

ONE POSSIABLE CYCLE OF PLL
(REF LEADING VAR)

LOW POWER CHARGE PUMP

BACKGROUND OF THE INVENTION

1. Field of the Invention

This invention relates generally to charge pumps and more particularly to a low power charge pump for use with a voltage controlled oscillator in a phase-locked loop frequency synthesizer.

2. Description of the Related Art

Frequency synthesizers typically employ phase-locked loops (PLLs) to generate oscillating signals at accurate frequencies. A prior art phase-locked loop is shown generally at 10 in FIG. 1. The PLL is constructed around a frequency generator which includes a voltage controlled oscillator (VCO) 12, a resonator 14, and a combined loop filter and carrier filter 16. These components are well-known in the art and will not be described further. The resonant frequency of the frequency generator is controlled by the voltage across a capacitor in the loop filter. By increasing or decreasing the amount of charge stored on the capacitor in a loop filter, the VCO can be made to oscillate at a specified frequency.

To provide accurate closed-loop control of the output frequency of the VCO, the oscillating output signal LO is coupled through a buffer 20 to a programmable divider 24. The programmable divider uses the oscillating signal from the VCO as a clock to decrement a digital counter, thereby generating a variable signal VAR which has a pulse indicative of the phase and frequency of the output signal from the VCO. A phase-frequency detector 26 compares the variable signal VAR with a reference signal REF and generates pump-up and pump-down direction control signals U and D in response to the relative phase and frequency of the REF and VAR signals. A charge pump 28 generates a control current signal IOUT in response to the control signals U and D. The control current signal IOUT typically sources or sinks a pulsed current of varying duration, but fixed amplitude in response to the U and D signals, thereby increasing or decreasing the voltage on the capacitor in the loop filter, and hence, changing the frequency and/or phase of the VCO output signal.

In operation, the PLL of FIG. 1 is provided with a reference signal REF which includes periodic pulses. The frequency generator portion of this circuit is constructed so that the resonant frequency of the VCO 12 and resonator 14 increases as the charge, and thus voltage, on the loop filter capacitor increases. If the operational frequency of the VCO is higher than a specified lock frequency, the oscillating signal LO1 causes the programmable divider 24 to generate the pulse in the VAR signal before the pulse is generated in the REF signal. This causes the phase-frequency detector 26 to activate the pump down signal D. The charge pump 28 then generates a control current signal IOUT which sinks a constant amplitude current, thereby reducing the charge on the loop filter capacitor, which in turn, reduces the operating frequency of the VCO. The charge pump continues sinking the constant current until the phase-frequency detector activates the pump up signal U in response to the next pulse in the REF signal.

In contrast, if the VCO is operating at a frequency lower than the specified lock frequency, the pulse in the REF signal arrives at the phase-frequency detector before the pulse in the VAR signal, and the phase-frequency detector activates the pump up signal U, thereby causing the charge pump to generate a control current signal IOUT which sources a constant current. This in turn, increases the voltage of the loop filter capacitor and causes the operating frequency of the VCO to increase. The charge pump continues sourcing the constant current until the pulse in the VAR signal arrives at the phase-frequency detector which causes the phase-frequency detector to activate the pump down signal D.

In either the "pump up" or "pump down" scenario, once both the pump up signal U and the pump down signal D are active at the same time, the charge pump 28 both sources and sinks the same constant current, thereby producing zero net current out of the charge pump. The pump up and pump down signals U and D are both deactivated simultaneously after a predetermined time delay, and the control cycle begins again. Thus, the phase-frequency detector and charge pump operate to maintain the frequency of the VCO at a specified lock frequency by providing source and sink current pulses to the loop filter capacitor.

Alternatively, the VCO can be designed to tune in the opposite manner, i.e., increasing the voltage on the loop filter tunes the VCO to a lower frequency, while decreasing the voltage on the loop filter tunes the VCO to a higher frequency.

The relative time duration of the pump up and pump down current pulses is determined by the phase difference between the leading edges of the pulses in the REF and VAR signals. The operating frequency of the PLL can be adjusted by programming a different number into the digital counter in the programmable divider 24. The oscillating output signal from the VCO provides the local oscillator signal LO2 in a communications circuit through a buffer 22.

The magnitude of the charging current and the time constant of the loop filter determine the acquisition time of the PLL. The noise of the charging current determines part of the phase noise of the PLL. To achieve fast acquisition and low phase noise, the charging current from the charge pump must be relatively large (in the range of several milliamps). In a PLL implemented on an integrated circuit, the charge pump can develop the charge current using a switched mirror scheme which consumes multiples of the required charging current. This results in a charge pump which consumes very large amounts of background power in order to achieve a given output current. However, phase-locked loops are often required to operate on battery power supplies which can only supply limited amounts of power at low supply voltages. Accordingly, a need remains for a technique for reducing the power consumption of a charge pump in a frequency synthesizer, while maintaining fast lock times and low noise.

SUMMARY OF THE INVENTION

Therefore, it is an object of the present invention to reduce the power consumption of a charge pump.

Another object of the present invention is to provide large instantaneous charging currents from a charge pump.

A further object of the present invention is to produce a large charging current from a low voltage power supply.

Yet another object of the present invention is to provide accurate charging currents from a charge pump.

To accomplish these and other objects, the Applicants have invented a technique for reducing the RMS power consumption of a charge pump while still supplying the high instantaneous charge pump currents required for high performance operation. The present invention eliminates wasted power by enabling a charge pump only when the loop filter needs to be updated, and disabling the charge pump when the loop filter does not need to be updated, thereby reducing the power consumption of the charge pump. A charge pump in accordance with the present invention can be enabled or disabled in response to an enable signal which is activated only when the loop filter is updated. In a preferred embodiment, the enable signal is activated by a look-ahead signal which is generated in advance of either a pulse from a reference signal or a pulse from a variable signal so as to allow the charge pump bias currents to stabilize before providing the charge current. The look-ahead signal is generated using logic signals which are native to the PLL's programmable divider and reference source. The charge pump is disabled by a reset signal which is activated by the phase-frequency detector when the loop filter is finished being updated.

One aspect of the present invention is a frequency synthesizer comprising a frequency generator for generating an oscillating signal responsive to a first control signal which adjusts the output frequency of the generator. The synthesizer includes a charge pump coupled to the frequency generator for generating the first control signal responsive to a second control signal which can include pump up and pump down signals. The charge pump can be controllably enabled and disabled to reduce the power consumption of the charge pump. The charge pump can be enabled and disabled responsive to the second control signal, but is preferably enabled or disabled responsive to an enable signal. The frequency synthesizer can include a latch coupled to the charge pump, the latch generating the enable signal responsive to a look-ahead signal.

Another aspect of the present invention is a charge pump comprising a current switch for generating a first control signal which sources or sinks current pulses responsive to a direction control signal and a bias signal. The charge pump includes a bias cell coupled to the current switch for generating the bias signal. The bias cell can be controllably enabled and disabled so as to enable and disable the current switch, thereby reducing the power consumption of the charge pump.

A further aspect of the present invention is a method for generating an oscillating signal comprising the steps of: enabling a charge pump for generating a control signal when the control signal needs to be generated; and disabling the charge pump when the control signal does not need to be generated, thereby reducing the power consumption of the charge pump. The charge pump can be enabled before the control signal needs to be generated. The method further includes the steps of: generating a look-ahead signal, and enabling the charge pump responsive to the look-ahead signal.

An advantage of the present invention is that it provides a large charging current from a charge pump while reducing the overall power consumption.

Another advantage of the present invention is that it provides high charging currents from a low voltage power supply.

A further advantage of the present invention is that it improves the performance of a charge pump in a phase-locked loop circuit while adding very little complexity to the circuit.

The foregoing and other objects, features and advantages of the invention will become more readily apparent from the following detailed description of a preferred embodiment of the invention which proceeds with reference to the accompanying drawings.

DETAILED DESCRIPTION

The present invention utilizes the principle that a charge pump in a phase locked loop typically only delivers a net current to the loop filter for a small fraction of the reference signal period, also referred to as an update cycle. The time during which a charge pump in a phase locked loop (PLL) actually delivers a net current to the loop filter is determined by the difference between the frequency of a reference signal and the frequency of a variable signal which is generated by dividing down the synthesized output frequency of the PLL. In acquisition, the charge pump can be delivering a net charging current to the capacitor in the loop filter during a large portion of the reference frequency period. However, once the loop is locked, which is a majority of the time, the charge pump only delivers a net current to the loop filter for a small fraction of the reference signal period, since the phase and frequency difference between the reference signal and the variable signal is very small. Thus, in lock, the majority of the power consumed by the charge pump is wasted during the time when no net current is being supplied to the loop filter. The present invention eliminates wasted power by enabling a charge pump only when the loop filter needs to be updated, and disabling the charge pump when the loop filter does not need to be updated, thereby reducing the power consumption of the charge pump.

Figure 2:
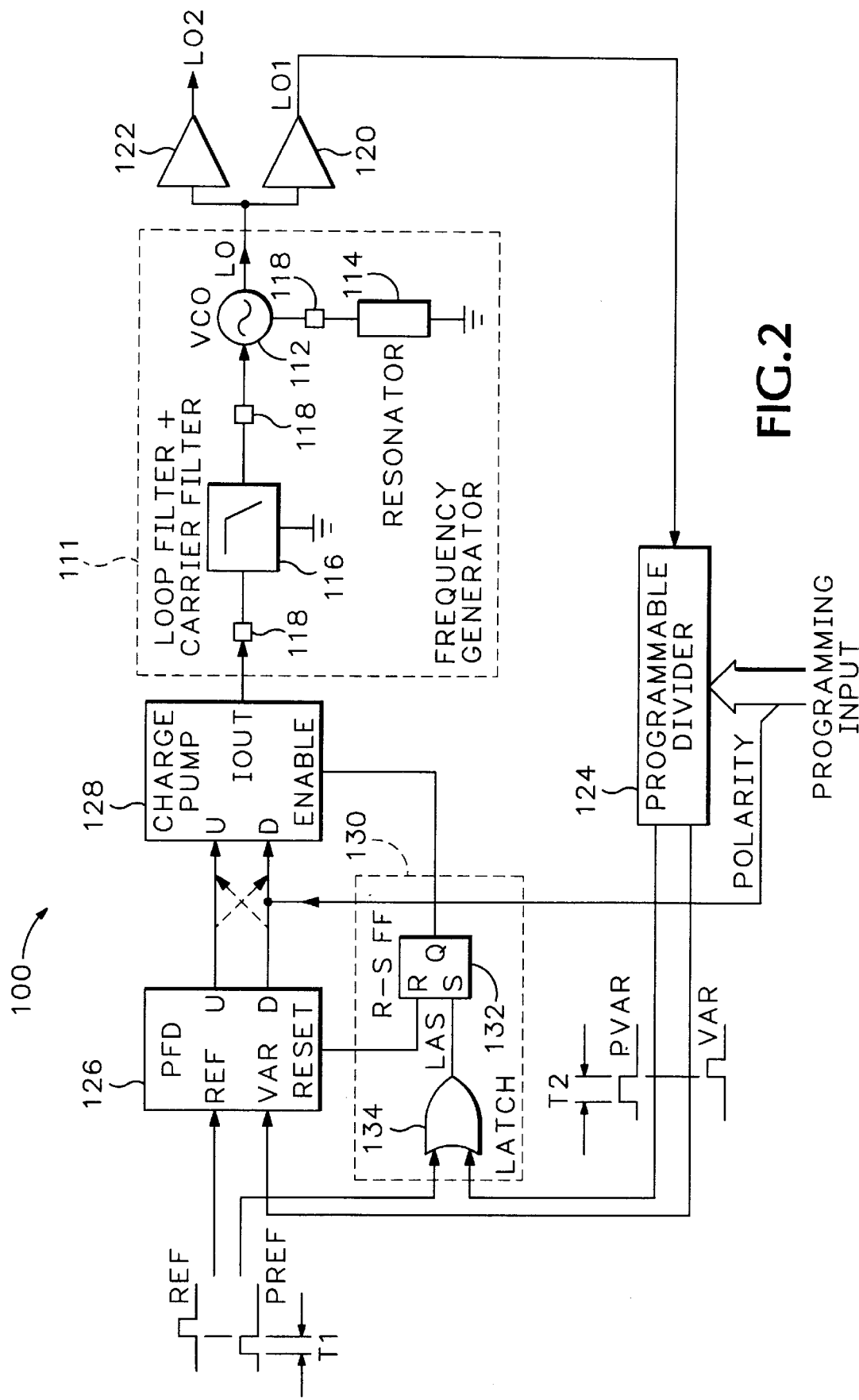
FIG. 2 is a block diagram of an embodiment of a phase-locked loop circuit in accordance with the present invention.

Indicated generally at 100 in FIG. 2 is an embodiment of a phase-locked loop (PLL) in accordance with the present invention. Prior to describing the detailed structure of the PLL 100, the key components of the system will be identified followed by a brief description of the operation of the system. Then a more detailed description of each of the components will be provided along with a more detailed description of the operation.

Figure 1:
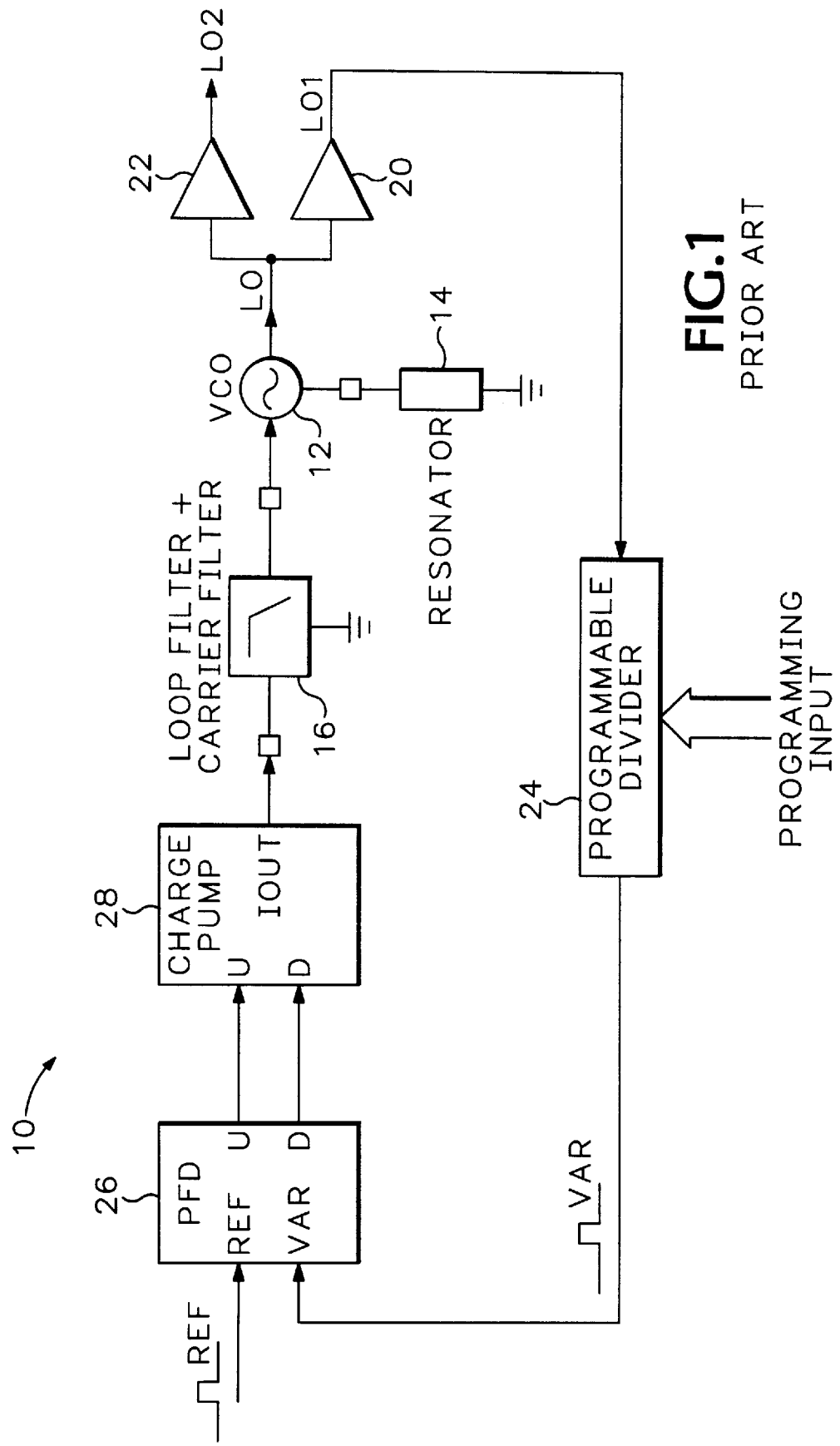
FIG. 1 is a block diagram of a prior art phase-locked loop circuit.

Referring to FIG. 2, the PLL 100 includes a frequency generator 111 having a voltage controlled oscillator (VCO) 112, a resonator 114, and a combined loop filter and carrier filter 116 which are essentially the same as those in the circuit of FIG. 1. The frequency generator 111 generates an oscillating output signal LO in response to a first control signal IOUT from a charge pump 128. The charge pump is capable of being enabled and disabled responsive to an enable signal ENABLE. The enable signal is generated by a latch 130 which activates the enable signal in response to a look-ahead signal LAS which is the logical OR of a reference look-ahead signal PREF and a variable look-ahead signal PVAR.

A phase-frequency detector 126 generates a second set of direction control signals, pump-up U, and pump-down D, in response to the reference signal REF and variable signal VAR, as well as a reset signal RESET which deactivates the enable signal through latch 130. The oscillating signal output LO from frequency generator 111 is coupled to a programmable divider 124 through a buffer 120. The programmable divider 124 uses the oscillating signal as a clock to decrement a digital counter, thereby generating the variable signal VAR and variable look-ahead signal PVAR. The variable look-ahead signal PVAR has a pulse with a leading edge that precedes the leading edge of a pulse in the variable signal VAR by a time T2 as illustrated in FIG. 2. The reference signal REF and reference look-ahead signal PREF are generated by a reference signal generator which produces an active pulse on the PREF signal having a leading edge which precedes the leading edge of a pulse on the REF signal by a time T1.

In operation, the frequency generator 111, programmable divider 124, and phase-frequency detector 126 operate in a manner similar to the corresponding components in the prior art circuit of FIG. 1. However, the charge pump of the embodiment of the present invention shown in FIG. 2 is normally disabled except when the control signal IOUT is needed to source or sink the charge current to update the loop filter capacitor. The charge pump 128 could be designed to be enabled in response to the activation of either the pump-up U signal or the pump-down D signal. This could be accomplished by enabling a first bias cell in response to the pump-up signal to generate a pump up current, and enabling a second bias cell in response to the pump-down to generate a pump down current. However, in the preferred embodiment shown in FIG. 2, the charge pump 128 is enabled in response to the look-ahead signal LAS so as to allow bias currents within the charge pump to stabilize before updating the loop filter. Since the PREF and PVAR signals are ORed together, the enable signal ENABLE is always activated a time T1 or T2 prior to the activation of control signals U or D, depending on whether the PREF pulse or PVAR pulse occurs first. Look-ahead delay intervals T1 and T2 need not be equal.

The phase-frequency detector 126 generates the reset signal RESET after some fixed delay which determines the minimum pulsewidth during which the charge pump is both sourcing and sinking current, and thus, is not providing any net charge current to the loop filter. The reset signal RESET resets the latch 130, thereby disabling the charge pump and conserving power. Thus, a phase-locked loop constructed in accordance with the present invention allows a charge pump to provide a very large instantaneous charge current signal, while still reducing the RMS power consumption of the circuit. By utilizing a look-ahead signal to allow the charge pump to stabilize, the accuracy of the pump-up and pump-down charge currents is maintained.

More detailed consideration will now be given to the structure of the PLL 100 of the present invention. The frequency generator 111 includes a voltage controlled oscillator (VCO) 112 which is coupled to a resonator 114 and a combined loop filter and carrier filter 116. The VCO 112 generates an oscillating signal LO in response to the charge, and thus voltage, on a capacitor in the loop filter. The charge on the loop filter capacitor is varied in response to the control signal IOUT from charge pump 128. When the control signal IOUT sources a charge current, it increases the charge on the loop filter capacitor, thereby causing the VCO to oscillate at a higher frequency. In a similar manner, when the control signal IOUT sinks a charge current, it reduces the voltage on the loop filter capacitor, thereby causing the VCO to oscillate at a lower frequency. Alternatively, the frequency generator can be designed to operate in the opposite manner, i.e., increasing the loop filter voltage decreases the operating frequency and vice versa.

In a PLL which is implemented on a semiconductor integrated circuit chip (IC), the resonator 114 and combined loop filter and carrier filter 116 can be external components which are coupled to the PLL through terminals 118. In a preferred embodiment, the loop filter, carrier filter, and resonator are implemented on the chip to reduce the number of external components required by the end user. The combined loop filter and carrier filter, VCO, and resonator are well-known in the art and will not be described in further detail.

The oscillating signal LO from the voltage controlled oscillator in the frequency generator 111 is coupled to the programmable divider 124 through a buffer 120. The programmable divider includes a digital counter having a plurality counter stages. The number of cycles of the oscillating signal LO, and thus the time between pulses in the variable signal VAR, is determined by a digital number which is latched into the programmable divider 124 through the programming input. The digital counter in the programmable divider uses the oscillating signal LO as a clock signal to decrement the counter. A pulse is generated on the variable signal VAR by the counter when it is decremented all the way to zero. The variable look-ahead signal PVAR has a pulse which is generated prior to the pulse on the VAR signal.

The programmable divider 124 can be constructed using several different design schemes which are generally known in the art. The PVAR signal is preferably generated internally during the normal operation of the programmable divider. For example, if the divider is implemented as a multi-stage ripple counter using a series of several D-flip flops, the VAR signal can be obtained from the final counter stage, while the PVAR signal is obtained from another counter stage earlier in the chain. By judicious selection of counter stages, the time T2 between the leading edges of the VAR and PVAR pulses can be selected so as to allow adequate time for the charge pump to stabilize. As another example, the PVAR signal can be generated by decoding a particular counter state which occurs prior to the zero-count "rollover." By selecting a different intermediate counter state, the width of the PVAR pulse T2 can be adjusted to an appropriate value. Thus, an advantage of the present invention is that it requires few additional components to implement since it utilizes a preexisting signal PVAR in the programmable divider 124.

The reference signal REF and reference look-ahead signal PREF are generated by a reference signal generator which includes a divider similar to the programmable divider. The reference signal generator divides down a highly accurate reference signal from a crystal oscillator using a digital counter. The digital counter generates a reference signal having a periodic pulse waveform. In an example embodiment, a 13 MHz crystal signal is divided by 65 to generate a pulsed reference signal REF having a 200 KHz operating frequency. As with the programmable divider, the reference signal REF and the reference look-ahead signal PREF can be obtained by tapping different stages of the digital counter, by decoding different intermediate states of the counter, or by delaying the start of th REF pulse relative to the PREF pulse using a shift register clocked by the high speed input clock. Thus, the time T1 between the leading edges of the REF pulse and PREF pulse can be adjusted to an appropriate value during design of the counter to allow the charge pump bias currents to stabilize after being enabled.

The phase-frequency detector (PFD) 126 is coupled to the programmable divider 124 to receive the variable signal VAR and to the reference signal generator to receive the reference signal REF. The PFD generates the direction control signals pump-up U and pump-down D, as well as the reset signal RESET. At the start of an update cycle, the REF and VAR signals are inactive as are the U, D, and RESET signals. If the REF pulse occurs before the VAR pulse, the phase-frequency detector 126 activates the U signal while maintaining the D signal in the inactive state. Then, when the VAR pulse occurs, the phase-frequency detector activates the D signal in addition to the U signal. The occurrence of the second pulse also starts a delay after which the phase-frequency detector activates the reset signal RESET. After a predetermined length of time, the U, D, and RESET signals are deactivated simultaneously, which turns off IOUT as well as the charge pump. The reset signal RESET is generated internally in the phase-frequency detector as a byproduct of its normal operation. The RESET signal is self-deactivated after a few gate delays. Since the RESET signal is generated during the normal operation of the phase-frequency detector, no additional circuitry is needed to adapt the phase-frequency detector to operation in the circuit of FIG. 2, with the possible exception of a buffer or inverter stage to drive the latch 130 with the RESET signal.

The latch 130 includes an R-S flip-flop 132 having a reset input R connected to the RESET output of the phase-frequency detector 126, a SET input connected to the output terminal of a two-input OR gate 134 to receive the look-ahead signal LAS, and an output Q connected to the ENABLE input terminal of the charge pump 128. The OR gate 134 has a first input terminal coupled to receive the reference look-ahead signal PREF from a reference signal generator, and a second input terminal coupled to receive the variable look-ahead signal PVAR from the programmable divider 124. The latch 130 generates the ENABLE signal in response to the look-ahead signal LAS which is the logical OR of the PREF and PVAR signals and in response to the RESET signal. The output Q of flip-flop 132 is preferably an open-collector device which sinks current when the ENABLE signal is active. The output Q is deactivated by the activation of the RESET signal. Although flip-flop 132 is shown in FIG. 132 as an R-S flip-flop, it can also be implemented as a D-type flip-flop in which the D input is connected to a logic high level, the look-ahead signal LAS is connected to the clock input, and the RESET signal is connected to a reset terminal on the D flip-flop. The ENABLE signal can also be implenented as either an active low or an active high signal, depending on the implementation.

The charge pump 128 includes an output terminal connected to the loop filter to provide the control current signal IOUT, which sources or sinks a charge current to adjust the charge, and thus voltage, of the loop filter capacitor. The charge pump generates the control current signal IOUT in response to a direction control signal from the phase-frequency detector 126 which includes the pump-up signal U and the pump-down signal D. Ideally, if both of the U and D signals are active or inactive at the same time, the IOUT signal does not source or sink any net current. If only the U signal is active, the charge pump sources a constant current, while if only the D signal is active the charge pump sinks a constant current. The charge pump is completely disabled when the ENABLE signal is inactive, in which case the charge pump consumes no supply power except for that caused by leakage current.

In a preferred embodiment, the phase-locked loop 100 of the present invention includes a polarity feature which allows the user to change the polarity of the U and D signals between the phase-frequency detector and the charge pump by changing the state of a POLARITY bit in the program-ming input. This can be accomplished with any suitable means such as a pair of multiplexers. This feature allows for the use of VCO topologies with resonator tuning characteristics for which the frequency of oscillation increases for decreasing voltage on the loop filter, and vice versa.

Figure 3:
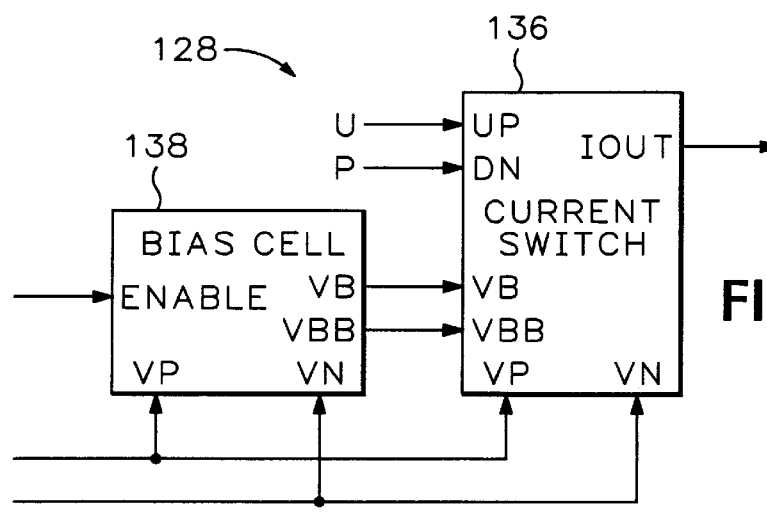
FIG. 3 is a block diagram showing more detail of an embodiment of a charge pump in accordance with the present invention.

FIG. 3 is a block diagram showing more detail of the charge pump 128 of FIG. 2. Referring to FIG. 3, the charge pump includes a current switch 136 which generates the control current signal IOUT in response to the control signals pump-up U and pump-down D. The current switch is capable of being disabled in response to bias signals VB and VBB to reduce the power consumption of the current switch. The bias signal VB provides a reference signal which determines the magnitude of the charge currents generated and switched by the current switch 136 and ultimately delivered to the IOUT terminal. The second bias signal VBB is used as reference signal for generating a constant current for improving the performance of a current mirror in the current switch as will be described 10 below. The reference signals VB and VBB are generated by a bias cell 138 which is capable of being disabled by the enable signal ENABLE to reduce the power consumption of the bias cell. Both the bias cell 138 and current switch 136 are powered by a positive power supply signal VP and a negative power supply signal VN. Alternatively, the charge pump can be implemented using only a single bias signal.

Figure 6:
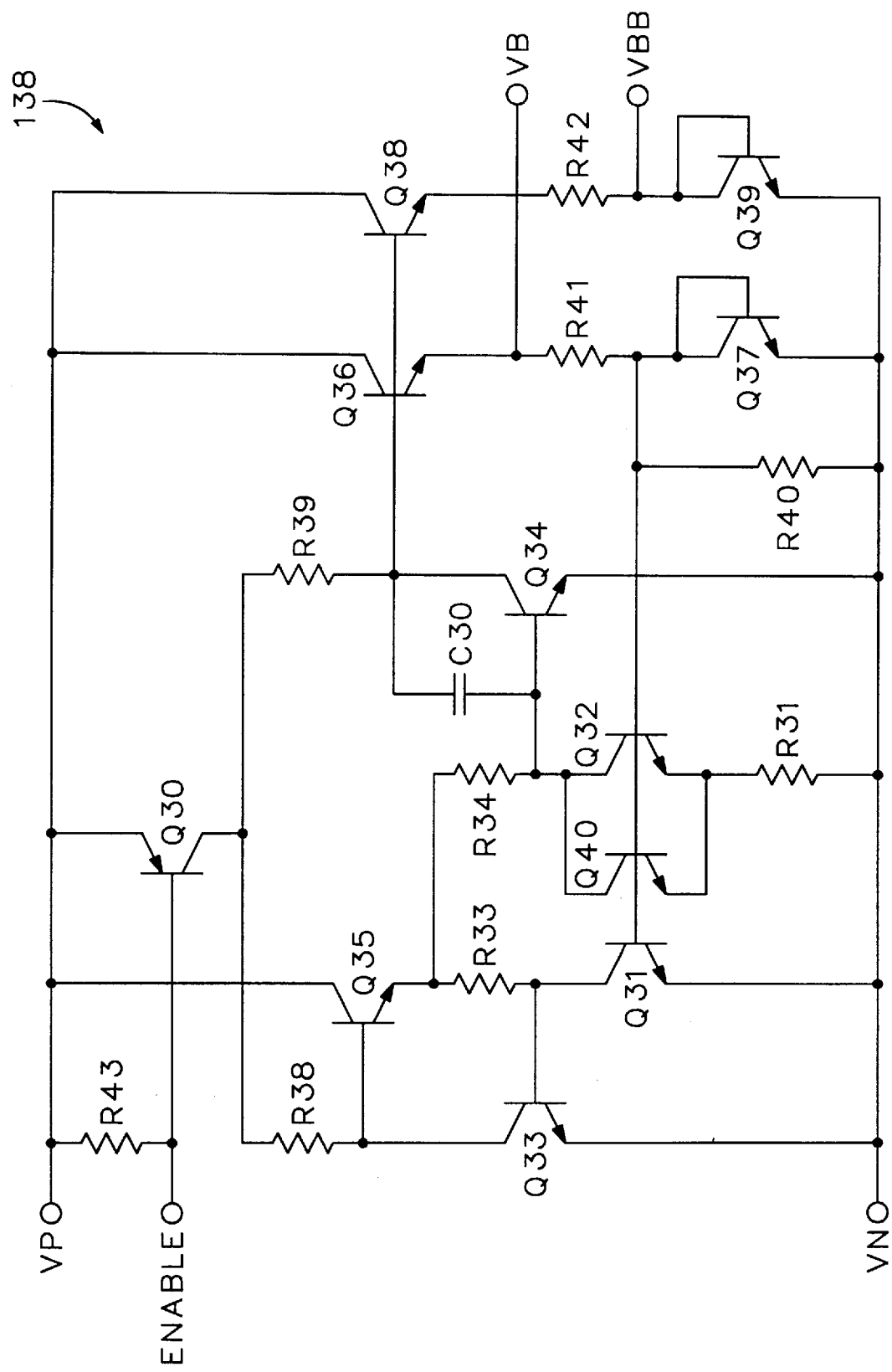
FIG. 6 is a schematic diagram showing more detail of the bias cell of FIG. 3.

Referring to FIG. 6, the bias cell 138 is constructed with a modified Brokaw cell which is known in the art. The ΔVbe section of the cell is left unchanged while a resistor R40 is connected across a diode connected transistor Q37 in the feedback path. This sets a complimentary to absolute temperature (CTAT) current in resistor R40 which is summed with the proportional to absolute temperature (PTAT) current generated by the ΔVbe cell. By selecting the correct resistor values and using proper degeneration resistors in the current sources in the current switch, which will be described below, the currents in the bias cell can be summed to produce temperature stable pump-up and pump-down currents in the current switch. The bias cell is switched on and off (enabled and disabled) by a saturating transistor Q30. The saturating transistor is driven by an open collector signal on the ENABLE line. Although the embodiment of the bias cell 138 shown in FIG. 6 is based on a Brokaw cell, other reference cells such as a Widlar cell can also be adapted to provide the bias signals.

Figure 4:
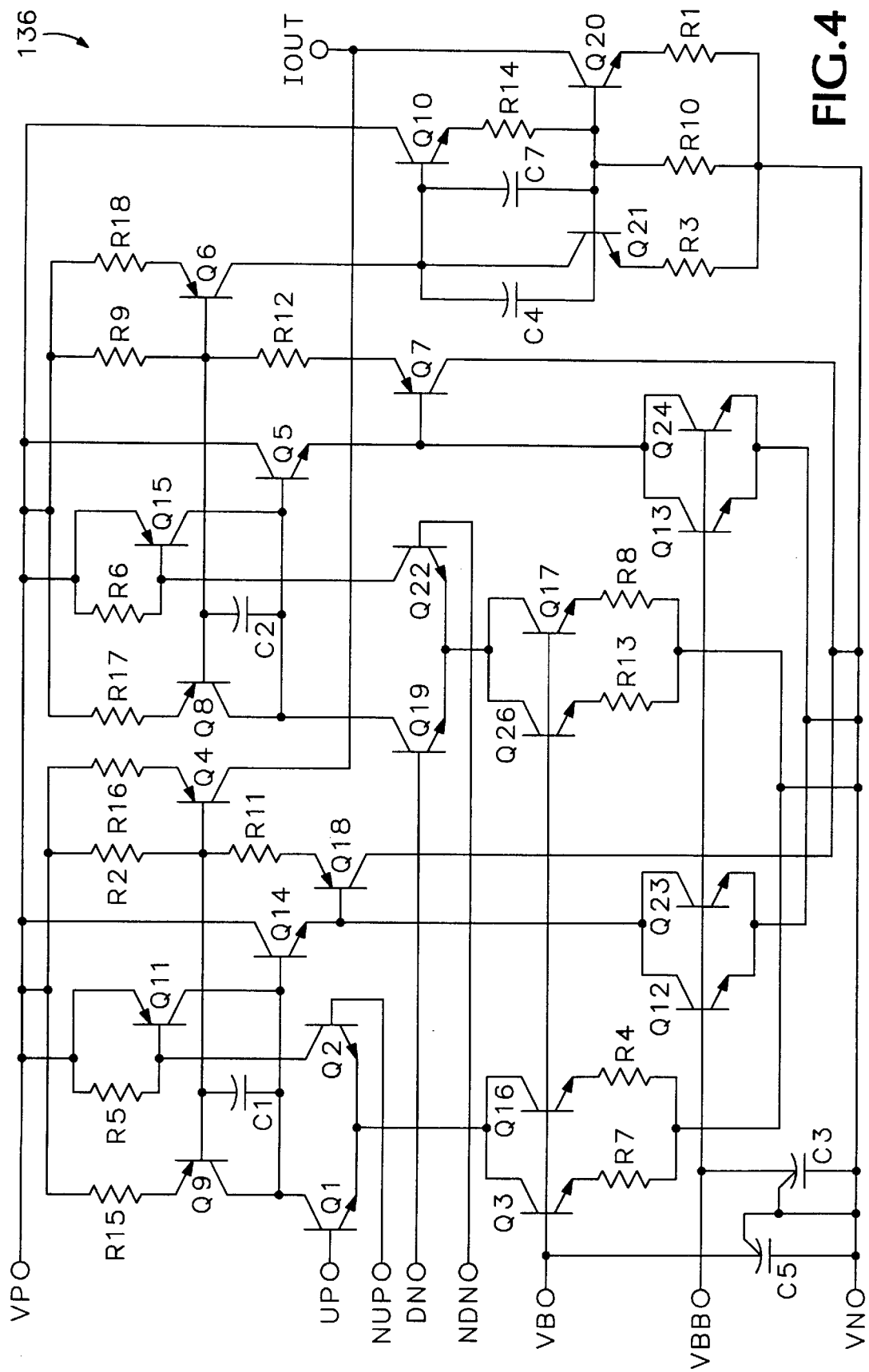
FIG. 4 is a schematic diagram showing more detail of the current switch circuit of FIG. 3.

FIG. 4 is a schematic diagram showing more detail of the current switch 136, which is constructed to provide temperature stable charge currents having high instantaneous values with low noise and high accuracy from a low voltage power supply. The pump-up current is generated by an emitter degenerated current source Q3,Q16 in response to the first bias signal VB. The pump-up current is switched by an emitter coupled differential pair Q1,Q2 which is controlled by the pump-up signal UP and its complement NUP. A first lateral PNP current mirror, which includes transistors Q9, Q4, Q18 and Q14, mirrors the pump-up current which current flows directly out of the collector of Q4 to the output terminal IOUT.

The use of a differential pair for switching the pump-up current allows the pump-up signal to be implemented in emitter coupled logic (ECL). When the pump-up signal UP is inactive, the pump-up current from the current source Q3,Q16 is diverted through transistor Q2 to the positive power supply VP. When the pump-up signal UP is active, the pump-up current is mirrored by the first PNP current mirror and sourced through the output terminal IOUT.

The pump-down current is generated by a second emitter degenerated current source Q26,Q17 in response to the first bias signal VB. The pump-down current is switched by a second emitter coupled pair Q19,Q22 in response to the pump-down signal DN and its complement NDN. A second lateral PNP current mirror including transistors Q8, Q6, Q7 and Q5 mirrors the pump-down current which is mirrored again by an NPN current mirror including transistors Q10, Q21 and Q20 which sinks the pump-down current from the output terminal IOUT. In a manner similar to the pump-up current, the pump-down current is diverted to the positive power supply VP through transistor Q22 when the pump-down signal DN is inactive.

If the pump-up and pump-down signals UP and DN are active at the same time, the source current from transistor Q4 is balanced by the sink current from transistor Q20, and no net charge current flows out of the output terminal IOUT except for a slight imbalance current resulting from minor mismatches in the transistors.

In order to provide the large pump-up and pump-down currents (about 5 milliamps in a preferred embodiment) large lateral PNP transistors are required for Q9 and Q4. Due to the poor gain of these devices, a PNP helper transistor Q18 is used to increase the loop gain of the current mirror. However, this takes up valuable power supply "head room," so an NPN transistor Q14 is added to make up a large portion of the power supply head room that is given up by Q18. Transistor Q14 increases the loop gain of the current mirror to an extent that a compensation capacitor C1, which is preferably a MOS capacitor, is required to stabilize the mirror. Transistor Q14 is biased by a separate current source Q12, Q23, which is not degenerated to conserve head room. The current through this current source is set such that the NPN transistor Q14 is always on during the transient switching of current through the mirror. Otherwise, if the base current through the PNP transistor Q18 is large enough, it diverts Q14's bias current and causes open loop operation. This results in long settling time for the output charge currents. Transistor Q18 would typically need to be fabricated as a lateral PNP device; however, its performance would increase if it was fabricated as a vertical PNP with a constrained collector.

A turn-off circuit which includes resistor R5 and saturating PNP transistor Q11 helps turn off Q18 by pulling the base of transistor Q14 to the positive power supply. Thus, the entire current mirror is deactivated when the pump-up signal UP is deactivated.

The second PNP current mirror which includes transistors Q6 and Q8 includes performance enhancements similar to those described for the first PNP current mirror, and thus, will not be described in detail.

When the first bias signal VB is inactive, the current sources Q3,Q16 and Q26,Q17 are disabled. Likewise, when the second bias signal VBB is inactive, the current sources Q12,Q23 and Q13,Q24 are disabled. Thus, when the bias signals VB and VBB are both deactivated, the entire current switch 136 is disabled and consumes essentially no current (except for leakage) even though it is still energized by the power supply voltage signals VP and VN. In a similar manner, when the ENABLE signal is inactive, the bias cell 138 is also disabled and consumes only leakage current even though it is still energized by the power supply signals VP and VN.

All three of the current mirrors in the current switch 136 are slightly degenerated to improve noise performance while maintaining low power supply operation.

In a phase-locked loop 100 which is implemented in a bipolar integrated circuit, some of the digital logic circuits, such as a prescaler in the programmable divider 124, are preferably fabricated in emitter coupled logic (ECL) for improved speed and/or noise immunity. However, many parts of the phase-locked loop are preferably fabricated in CMOS to reduce power consumption and the amount of chip space required for the circuit.

It should also be noted that a different topology might be used for the current switch in a CMOS implementation.

Figure 5:
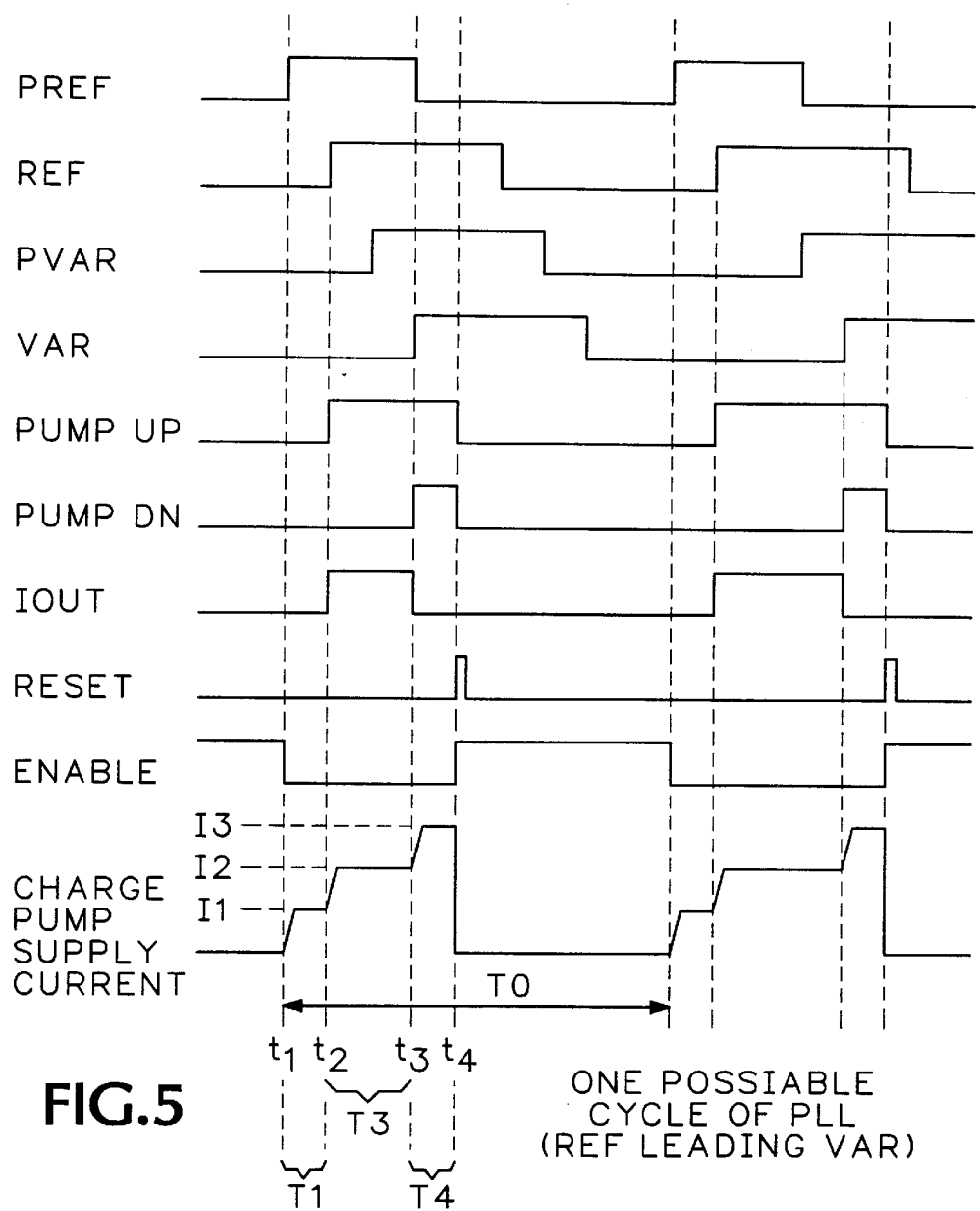
FIG. 5 is a timing diagram showing waveforms of signals at various points in FIGS. 2, 3 and 4.

More detailed consideration will now be given to the operation of the present invention with reference to FIGS. 2, 3, 4, and 5. The phase-locked loop 100 updates the loop filter at a periodic rate which is determined by the frequency of the reference signal REF. The reference frequency is typically less than the desired synthesized frequency of the output oscillating signal LO. In an example embodiment, the reference signal operates at a frequency of 200 KHz resulting in a reference signal period T0 of 5 microseconds as shown in FIG. 5. During the portion of an update cycle in which the programmable divider is still counting down, the signals PREF and PVAR are inactive, as is the open collector enable signal ENABLE, and thus, the charge pump is disabled and drawing no supply current.

In the example of FIG. 5, the REF pulse leads the VAR pulse. That is, the VCO is operating at a lower frequency than desired. At time t1 in FIG. 5, the PREF signal is activated which activates the ENABLE signal by setting the R-S latch 12 of FIG. 2 to the "high" logic level. This enables the charge pump 128 which begins drawing power supply current at first level I1 due to the operation of the bias cell 138 and the current sources in the current switch 136. The charge pump current continues to draw this first level of power supply current during the look-ahead period T1. The length of the look-ahead period T1 should be long enough to allow the bias cell and current sources in the current switch to stabilize before the occurrence of either the REF pulse or the VAR pulse. In a bipolar implementation, a look-ahead period of about 80 nano seconds is typically adequate to allow the charge pump to stabilize.

At time t2 in FIG. 5, the leading edge of the REF pulse arrives at the phase-frequency detector causing the pump-up signal U to switch to the active state. This causes the first current mirror in the current switch 136 to turn on and begin sourcing a constant current to the loop filter. This, in turn, causes an increase in the charge pump's supply current to a second level I2 during the time T3 which lasts until time t3 when the leading edge of the VAR pulse arrives at the phase-frequency detector.

The duration of the time period T3 between t2 and t3 is determined by the phase difference and the actual instantaneous frequency of the oscillating signal LO and the desired synthesized frequency and phase. Once the phase-locked loop locks onto the desired frequency and phase, the time between the leading edges of the REF and VAR pulses is ideally zero, and thus, the charge current pulse IOUT is very short.

At time t3, the leading edge of the VAR pulse causes the phase-frequency detector to activate the pump-down signal D as well as start the RC delay cycle which generates the RESET pulse. With both the pump-up and pump-down signals active, all of the current mirrors in current switch 136 are turned on, and the source and sink currents cancel and the charge pump supplies no net current to the loop filter. However, during time period T4 when both the pump-up and pump-down signals are active, the charge pump is drawing supply current at a third, higher rate I3.

At time t4, the RC network in the phase-frequency detector is charged up enough to generate a very narrow reset pulse (about one gate delay wide). The leading edge of this reset pulse resets the pump-up and pump-down signals and causes the latch 130 to deactivate the ENABLE signal, thereby disabling the charge pump. The falling edges of the pump-up and pump-down signals cause the turn-off circuits, which include Q11 and Q15, in the current switch to quickly turn off the PNP current mirrors at essentially the same time. Due to the construction of the bias cell 138, there is a short delay between the deactivation of the ENABLE signal and the bias signals VB and VBB. Thus, the entire charge pump is not completely disabled until shortly after the deactivation of the RESET signal.

The update cycle illustrated in FIG. 5 is representative of the situation in which the REF pulse leads the VAR pulse. However, the operation would be similar when the VAR pulse leads the REF pulse, in which case the IOUT signal would have a negative current pulse during time period T3. Also, if the VAR pulse leads the REF pulse, the time period T1 would be replaced by the time period T2 between the leading edges of the PVAR and VAR pulses as shown in FIG. 2.

Having described and illustrated the principles of the invention in a preferred embodiment thereof, it should be apparent that the invention can be modified in arrangement and detail without departing from such principles. We claim all modifications and variations coming within the spirit and scope of the following claims.

We claim:

1. A frequency synthesizer comprising:
   a frequency generator for generating an oscillating signal responsive to a first control signal;
   a charge pump coupled to the frequency generator for generating the first control signal responsive to a second control signal, wherein the charge pump can be controllably enabled and disabled to reduce the power consumption of the charge pump, and wherein the charge pump is enabled and disabled responsive to an enable signal;
   a latch coupled to the charge pump, the latch generating the enable signal responsive to a look-ahead signal, wherein the latch includes a flip-flop coupled to the charge pump, the flip flop activating the enable signal responsive to the look-ahead signal and deactivating the enable signal responsive to a reset signal; and
   a phase detector coupled to the charge pump and the latch, the phase detector generating the second control signal and the reset signal responsive to a reference signal and a variable signal.

2. A frequency synthesizer according to claim 1 further including a programmable divider coupled to the frequency generator and the phase detector, the programmable divider generating the variable signal responsive to the oscillating signal.

3. A frequency synthesizer according to claim 2 wherein:
   the progammable divider generates a variable look-ahead signal; and
   the latch further includes an OR gate coupled to the flip-flop and the programmable divider, the OR gate generating the look-ahead signal responsive to the variable look-ahead signal and a reference look-ahead signal.

4. A frequency synthesizer according to claim 3 wherein:
   the programmable divider includes a plurality of counter stages;
   a first one of the counter stages generates the variable signal; and
   a second one of the counter stages generates the variable look-ahead signal.

5. A frequency synthesizer according to claim 1 wherein:
   the second control signal includes a first direction signal and a second direction signal; and
   the phase detector activates one of the direction signals when the reference signal is activated and activates the other direction signal when the variable signal is activated.

6. A frequency synthesizer according to claim 5 wherein the phase detector changes the state of the reset signal a predetermined length of time after both of the direction signals are activated.

7. A charge pump comprising:
   a current switch for generating a first control signal responsive to a second control signal and a bias signal; and
   a bias cell coupled to the current switch for generating the bias signal;
   wherein the bias cell can be controllably enabled and disabled so as to enable and disable the current switch, thereby reducing the power consumption of the charge pump;
   wherein the second control signal includes a first direction signal and a second direction signal, and the first control signal sources a first current responsive to the first direction signal and sinks a second current responsive to the second direction signal; and
   wherein the current switch includes:
      a first current source coupled to the bias cell to generate the first current responsive to the bias signal;
      a first switch coupled to the first current source to enable the charge pump to source the first current responsive to the first direction signal;
      a current mirror coupled to the first switch to mirror the first current;
      a second current source coupled to the bias cell to generate the second current responsive to the bias signal; and
      a second switch coupled to the second current source to enable the charge pump to sink the second current responsive to the second direction signal.

8. A charge pump according to claim 7 wherein the current switch further includes:
   a second current mirror coupled to the second current source to mirror the second current; and
   a third current mirror coupled to the second current mirror to mirror the second current.

9. A charge pump comprising:
   a current switch for generating a first control signal responsive to a second control signal and a bias signal; and
   a bias cell coupled to the current switch for generating the bias signal;
   wherein the bias cell can be controllably enabled and disabled so as to enable and disable the current switch, thereby reducing the power consumption of the charge pump; and
   wherein the bias cell generates a second bias signal which can be deactivated responsive to an enable signal.

10. A method for generating an oscillating signal comprising:
    locking the oscillating signal;
    enabling a charge pump for generating a control signal when the control signal needs to be generated;

disabling the charge pump when the control signal does not need to be generated, thereby reducing the power consumption of the charge pump;

generating a reference signal;

generating a reference look-ahead signal which is activated before the reference signal is activated; and enabling the charge pump responsive to the reference look-ahead signal;

wherein the charge pump is intermittently enabled and disabled while the oscillating signal is locked.

11. A method according to claim 10 wherein generating the look-ahead signal further includes:

generating a variable signal; and generating a variable look-ahead signal which is activated before the variable signal is activated.

12. A method according to claim 11 wherein generating the look-ahead signal further includes combining the reference look-ahead signal and the variable look-ahead signal.

13. A frequency synthesizer comprising:

a frequency generator for generating an oscillating signal;

a charge pump coupled to the frequency generator for cyclically updating the frequency generator;

a detector circuit coupled to the frequency generator and the charge pump for controlling the charge pump responsive to the oscillating signal and a reference signal so as to lock the oscillating signal with the reference signal;

a control circuit coupled to the charge pump for disabling the charge pump during a portion of each update cycle; and a divider coupled between the frequency generator and the detector for dividing the oscillating signal, thereby generating a variable signal;

wherein the control circuit enables the charge pump responsive to either the reference signal or the variable signal and disables the charge pump responsive to a reset signal from the detector circuit.

14. A method for locking an oscillating signal comprising:

generating the oscillating signal responsive to the state of a filter;

detecting the difference between the oscillating signal and a reference signal;

cylically updating the filter with a charge pump responsive to the difference between the oscillating signal and a reference signal;

disabling the charge pump during a portion of each update cycle;

dividing the oscillating signal, thereby generating a variable signal;

enabling the charge pump when the first of either the reference pulse or the variable pulse occurs during each update cycle; and enabling the charge pump prior to the occurrence of either the reference pulse or the variable pulse, thereby allowing the charge pump to stabilize;

wherein a reference pulse occurs in the reference signal during each update cycle, and a variable pulse occurs in the variable signal during each update cycle; and wherein enabling the charge pump prior to the occurrence of either the reference pulse or the variable pulse includes:

generating a reference look-ahead signal responsive to the reference signal;

generating a variable look-ahead signal responsive to the variable signal; and enabling the charge pump responsive to the reference look-ahead signal or the variable look-ahead signal.

* * * * *